US009869699B2

(12) United States Patent
Dalebroux (10) Patent No.: US 9,869,699 B2
(45) Date of Patent: Jan. 16, 2018

(54) INTERNAL CHIRP GENERATOR WITH TIME ALIGNED ACQUISITION IN A MIXED-DOMAIN OSCILLOSCOPE (71) Applicant: Tektronix, Inc., Beaverton, OR (US)

(72) Inventor: Donald J. Dalebroux, Vernonia, OR (US)

(73) Assignee: Tektronix, Inc., Beaverton, OR (US)

(*) Notice: Subject to any disclaimer, the term of this patent is extended or adjusted under 35 U.S.C. 154(b) by 23 days.

(21) Appl. No.: 14/974,298

(22) Filed: Dec. 18, 2015

(65) Prior Publication Data

US 2016/0103154 A1 Apr. 14, 2016

Related U.S. Application Data (62) Division of application No. 13/658,563, filed on Oct. 23, 2012, now Pat. No. 9,304,148.

(51) Int. Cl.
*G01R 13/02* (2006.01)
*G01R 31/28* (2006.01)
(Continued)

(52) U.S. Cl.
CPC ..... *G01R 13/0245* (2013.01); *G01R 13/0236* (2013.01); *G01R 13/0272* (2013.01);
(Continued)

(58) Field of Classification Search
CPC .................. G01R 13/0236; G01R 31/2837
See application file for complete search history.

(56) References Cited

U.S. PATENT DOCUMENTS 6,344,749 B1 * 2/2002 Williams ............. H05K 9/0069
324/620
6,473,701 B1 * 10/2002 Tallman ............. G01R 13/0272
324/121 R
(Continued)

FOREIGN PATENT DOCUMENTS

CN 102062796 5/2011
DE 102007025578 A1 12/2008
(Continued)

OTHER PUBLICATIONS

European Search Report dated Feb. 9, 2017 in European Patent Application No. 13189378.6 (9 pages).

*Primary Examiner* — Jermele M Hollington
(74) *Attorney, Agent, or Firm* — Marger Johnson; Kevin Dothager (57) ABSTRACT A mixed-domain oscilloscope (MDO) includes a signal generator configured to generate a test signal having a span ranging from a user-configurable start frequency to a user configurable stop frequency, an output channel coupled to the signal generator and configured to transmit the test signal, an RF input channel configured to receive a return signal based on the test signal, an acquisition section configured to acquire and digitize the return signal as an acquisition record, and a ramp busy signal generator configured to substantially time-align the acquisition record with the test signal. The test signal includes a chirp signal that is a linearly swept sine wave that spans between the user-configurable start frequency and the user-configurable stop frequency. Methods include calibrating the chirp signal, connecting the MDO in various test configurations relative to external return loss bridge and DUT equipment, and performing measurements such as S21 (db), S11 (db), and distance-to-fault type measurements.

9 Claims, 9 Drawing Sheets (51) Int. Cl.
*G01R 27/04* (2006.01)
*G01R 27/28* (2006.01)

(52) U.S. Cl.
CPC .......... *G01R 31/2837* (2013.01); *G01R 27/04* (2013.01); *G01R 27/28* (2013.01)

(56) References Cited

U.S. PATENT DOCUMENTS

| | | |
|---|---|---|
| 8,324,885 B2 | 12/2012 | Dobyns |
| 8,588,703 B2 | 11/2013 | Pickerd et al. |
| 8,872,504 B2 | 10/2014 | Suryan |
| 9,304,148 B2 * | 4/2016 | Dalebroux ......... G01R 13/0236 |
| 2012/0007583 A1 | 1/2012 | Maertens et al. |
| 2012/0038369 A1 | 2/2012 | Dobyns et al. |
| 2012/0136600 A1 | 5/2012 | Tarng |
| 2012/0310601 A1 | 12/2012 | Martin |
| 2013/0093493 A1 | 4/2013 | Pickerd et al. |
| 2014/0095098 A1 | 4/2014 | Niles et al. |
| 2014/0142880 A1 | 5/2014 | Dobyns et al. |
| 2014/0172339 A1 | 6/2014 | Dees et al. |

FOREIGN PATENT DOCUMENTS

| | | | |
|---|---|---|---|
| EP | 2418497 | A2 | 2/2012 |
| WO | 0046612 | A1 | 8/2000 |

\* cited by examiner

INTERNAL CHIRP GENERATOR WITH TIME ALIGNED ACQUISITION IN A MIXED-DOMAIN OSCILLOSCOPE

CROSS REFERENCED TO RELATED APPLICATIONS

This application is a divisional of U.S. Non-Provisional application Ser. No. 13/658,563, filed Oct. 23, 2012, herein incorporated by reference.

BACKGROUND

Embodiments of the present invention relate to mixed-domain oscilloscopes, and more particularly, to instruments, systems and methods for making measurements on a mixed-domain oscilloscope using an internal chirp generator, an output channel, an RF input channel, and time alignment logic.

Unlike traditional swept or stepped spectrum analyzers, a mixed-domain oscilloscope (MDO) uses fixed local oscillators (LOs) to block convert wide swaths of bandwidth as opposed to sweeping or stepping an LO through an equivalent wide bandwidth. Traditional spectrum analyzers provide a tracking generator, which uses the swept or stepped LO to produce a signal that tracks with the sweep of the analyzer. The swept signal is fed to a network or device under test and the resulting signal is analyzed using the spectrum analyzer. This is known in the industry as a "poor man's network analyzer" because while this technique provides a useful method for determining scalar measurements, it is incapable of providing vector measurements as provided by conventional network analyzers.

There is a trend in the test and measurement field to provide multiple functions that were traditionally provided in separate instruments, within a single test and measurement instrument in a time-correlated fashion. One such instrument is the MDO, which includes digital channels, analog channels, and an RF input channel all within a single instrument. Presently, MDOs do not offer a "poor man's network analyzer" capability because the typical approach uses the swept or stepped LO approach, which differs from the traditional way in which data is acquired and processed on an MDO.

It would be desirable to provide an MDO with an internal chirp generator and the capability of transmitting a chirp signal. Moreover, it would be desirable to provide time alignment logic for time aligning the chirp signal with an acquisition so that a user can obtain and analyze measurements such as scalar s parameters. Embodiments of the invention address these and other limitations in the prior art.

The foregoing and other features and advantages of the inventive concepts will become more readily apparent from the following detailed description of the example embodiments, which proceeds with reference to the accompanying drawings.

DETAILED DESCRIPTION

Reference will now be made in detail to embodiments of the present invention, examples of which are illustrated in the accompanying drawings. In the following detailed description, numerous specific details are set forth to enable a thorough understanding of the inventive concepts. It should be understood, however, that persons having ordinary skill in the art may practice the inventive concepts without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first port could be termed a second port, and, similarly, a second port could be termed a first port, without departing from the scope of the inventive concept.

The terminology used in the description of the various embodiments herein is for the purpose of describing particular embodiments only and is not intended to be limiting of the inventive concepts. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the invention include instruments, systems and methods for making measurements on a mixed-domain oscilloscope (MDO) using an internal chirp generator, an output channel, an RF input channel, and time alignment logic. For example, the MDO can take 2 port scalar s parameter measurements, otherwise known by persons having skill in the art as S21 or S21 (db) when the magnitude is presented in decibels. By way of another example, the MDO can take single port scalar s parameter measurements, otherwise known as S11 or S11 (db). In addition, the MDO according to inventive aspects disclosed herein can make distance-to-fault measurements, and the like.

Since a local oscillator (LO) of an MDO is fundamentally different than that of a traditional spectrum analyzer, the typical "poor man's network analyzer" approach using a swept or stepped LO in combination with a tracking generator is not suitable. Rather, as disclosed in detail herein, the MDO uses an internally generated test signal, referred to as a "linear chirp" or "chirp signal" that ranges from a user-configurable start frequency to a user-configurable stop frequency. In other words, the user-configurable start frequency corresponds to a beginning frequency of the chirp signal and the user-configurable stop frequency corresponds to an ending frequency of the chirp signal. The chirp signal is a linearly swept sine wave between the predefined beginning and ending frequencies. The start and stop frequency of the chirp signal correspond to user configurable start and stop frequency settings of the MDO. The time duration and amplitude of the chirp signal can also be controlled within the limits of the hardware.

In addition, the MDO includes time alignment logic including a chirp signal generator to produce the chirp signal and a ramp busy signal generator to produce a ramp busy signal. The ramp busy signal generator provides a ramp busy signal for the duration of the chirp signal so that an acquisition record that represents the displayed spectrum can be time-aligned with the chirp signal. In this manner, the entire chirp can be captured in a single acquisition. Notably, the entire spectrum is processed and updated with each acquisition rather than one frequency point at a time as in the case of a swept or stepped method. In other words, using the conventional swept or stepped method, at any point in time, a single frequency is being processed, whereas the inventive aspects disclosed herein include simultaneously processing a large swath of frequencies within the time period of a single acquisition.

Figure 1A:
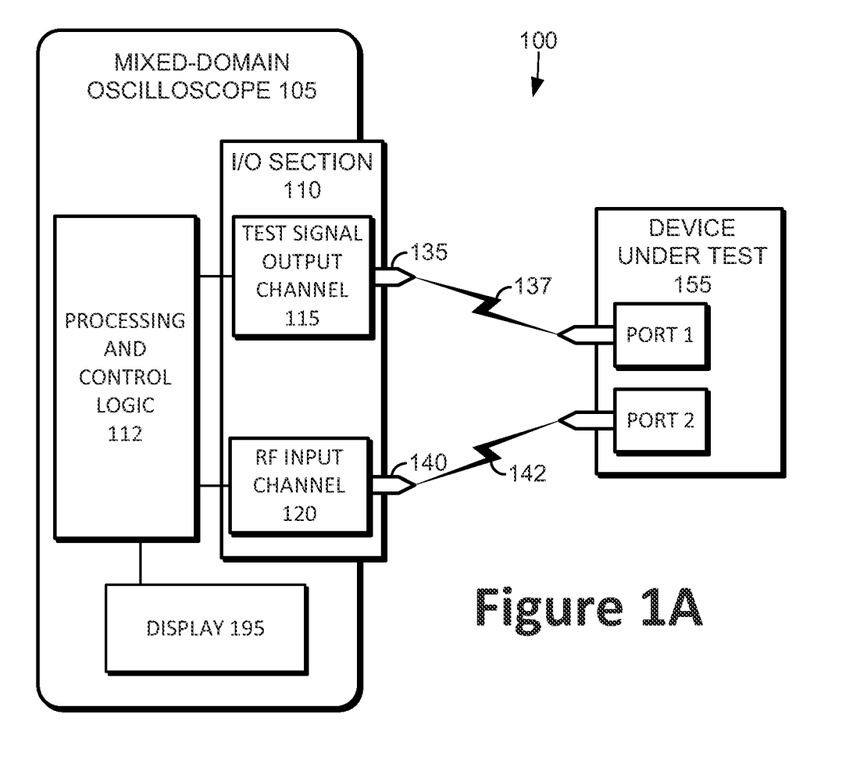
FIG. 1 is an example block diagram of a system including a mixed-domain oscilloscope (MDO) and a device under test in accordance with some embodiments of the present invention.

FIG. 1A is an example block diagram of a system 100 including a mixed-domain oscilloscope (MDO) 105 and a device under test (DUT) 155 in accordance with some embodiments of the present invention. The MDO 105 includes an I/O section 110. The I/O section 110 includes a test signal output channel 115 and associated output port 135. The I/O section 110 also includes an RF input channel 120 and associated input port 140.

The DUT 155 receives the test signal 137 via a first port (i.e., Port 1). The DUT 155 processes the test signal 137 and returns a return signal 142 to the MDO 105 via a second port (i.e., Port 2). The MDO 105 receives the return signal 142 via the input port 140. The processing and control logic 112 is coupled to the RF input channel 120 and is configured to acquire and digitize a return signal 142 as an acquisition record, which is described in further detail below. The processing and control logic 112 time-aligns the acquisition record with the test signal, which is also further described in detail below. The processing and control logic 112 causes a spectrum of frequencies associated with the return signal 142 to be displayed on the display 195. The processing and control logic 112 may include or otherwise be implemented by hardware, firmware, software, or any suitable combination thereof.

Figure 1B:
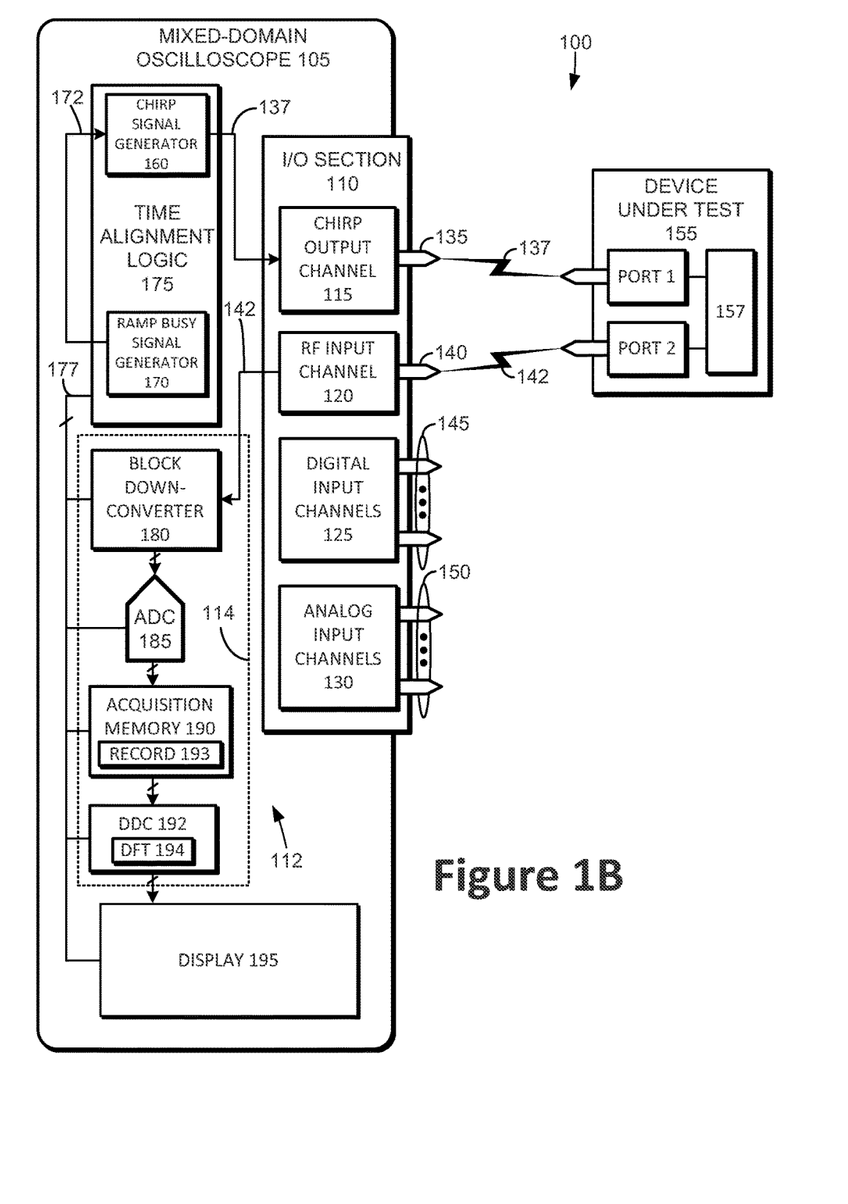
FIG. 1B is an example block diagram of a system including a more detailed view of the MDO and the device under test of FIG. 1A in accordance with some embodiments of the present invention.

FIG. 1B is an example block diagram of a system 100 including a more detailed view of the MDO 105 and the DUT 155 of FIG. 1A in accordance with some embodiments of the present invention. The processing and control logic 112 of the MDO 105 can include time alignment logic 175 and an acquisition section 114. The example system 100 is particularly useful for making a 2 port scalar s parameter measurement, or in other words, an S21 (db) measurement.

In addition to the output channel 115 and the RF input channel 120, the I/O section 110 may also include one or more digital input channels 125 and associated ports 145, and one or more analog input channels 130 and associated ports 150. The processing and control logic 112 is configured to generate a test signal 137, such as a chirp signal, which is transmitted by the test signal output channel 115 via the output port 135.

The time alignment logic 175 can include a chirp signal generator 160 to generate a test signal 137, such as a chirp signal, having a span ranging from a user-configurable start frequency to a user-configurable stop frequency. The chirp output channel 115 is coupled to the chirp signal generator 160. The chirp output channel 115 transmits the chirp signal 137 via the output port 135. The chirp signal 137 is a linearly swept sine wave configured to span between the user-configurable start frequency and the user-configurable stop frequency.

It will be understood that the test signal 137 can be a signal other than a chirp signal. For example, the test signal 137 can alternatively be a continuous wave (CW) signal. In the case where the test signal 137 is a CW signal, individual frequencies are transmitted to the DUT 155, acquired by the MDO 105, and individually processed by the processing and control logic 112. Nevertheless, for the sake of consistency, the test signal 137 will generally be referred herein as the chirp signal 137.

Referring once again to the time alignment logic 175, a ramp busy signal generator 170 is configured to generate a ramp busy signal 172. The chirp signal generator 160 is configured to transmit the chirp signal 137 responsive to the ramp busy signal 172. The ramp busy signal 172 is used to produce the chirp signal 137. In addition, the ramp busy signal 172 is used to substantially time-align an acquisition record 193, that gets stored in the acquisition memory 190, with the chirp signal 137, as described in further detail below. The chirp signal generator 160 receives the ramp busy signal 172 and produces the chirp signal 137 for the duration of the ramp busy signal 172.

The ramp busy signal derives its name from a ramped voltage that follows the chirp of the signal. For example, a lower voltage can correlate to a lower frequency, and as the ramp busy signal 172 ramps upward, the frequency of the chirp signal 137 increases over the predefined span. Alternatively, the frequency of the chirp signal 137 can decrease over the predefined span. As another alternative, the ramp busy signal 172 can ramp downward. The frequency of the chirp signal 137 can increase or decrease responsive to the ramp busy signal 172. The acquisition section 114 can also receive the ramp busy signal 172 via control lines 177 so that the acquisition record 193 can be automatically time-aligned to the transmission of the chirp signal 137. That is, the acquisition record 193 can be time-aligned to the chirp signal 137 after the chirp signal 137 is processed by the DUT 155 and returned in the form of the return signal 142.

The acquisition section 114 of the processing and control logic 112 includes a block down-converter 180, an analog-to-digital converter (ADC) 185, acquisition memory 190, and a digital down-converter (DDC) 192. The acquisition section 114 is configured to acquire and digitize the return signal 142 as an acquisition record 193 in the acquisition memory 190.

The return signal 142 is based on the chirp signal 137. In other words, the return signal 142 is the chirp signal 137 after it is transmitted to and returned by the DUT 155. The DUT 155 may cause the chirp signal 137 to be altered, for example, by a band pass filter 157 or other components 157 present within the DUT 155. Nevertheless, the return signal 142 returned by the DUT 155 is derived at least in part by the chirp signal 137. The acquisition section 114 is configured to acquire, in a single acquisition, substantially the entire chirp signal 137. That is, the acquisition section 114 is configured to acquire, in a single acquisition, the entire chirp signal 137 after being processed by the DUT 155 and returned in the form of the return signal 142. A length of the acquisition record corresponds to the span of the chirp signal less a first margin at a beginning of the chirp signal and less a second margin at an ending of the chirp signal, as further described below.

The ADC 185 digitizes the return signal 142. The block down-converter 180 is coupled to the ADC 185 and to the RF input channel 120. The block down-converter 180 receives the return signal 142 from the RF input channel 120 and block feeds the return signal 142 to the ADC 185. The acquisition memory 190 is coupled to the ADC 185 and stores the digitized return signal 142 as the acquisition record 193. The DDC 192 is coupled to the acquisition memory 190 and is configured to digitally down-convert the digitized signal to a frequency span ranging from the user-configurable start frequency to the user-configurable stop frequency. The DDC 192 may include a Discrete Fourier transform (DFT) section 194, which converts the digitized signal to the frequency domain.

The processing and control logic 112 is coupled to the display 195. The display 195 is configured to display a spectrum of the return signal 142 so as to provide a variety of measurements, such as a 2 port scalar s parameter measurement, a single port scalar s parameter measurement, a distance-to-fault measurement, and the like. As explained above, the system configuration 100 shown in FIG. 1B is particularly useful for making a 2 port scalar s parameter measurement.

Figure 2:
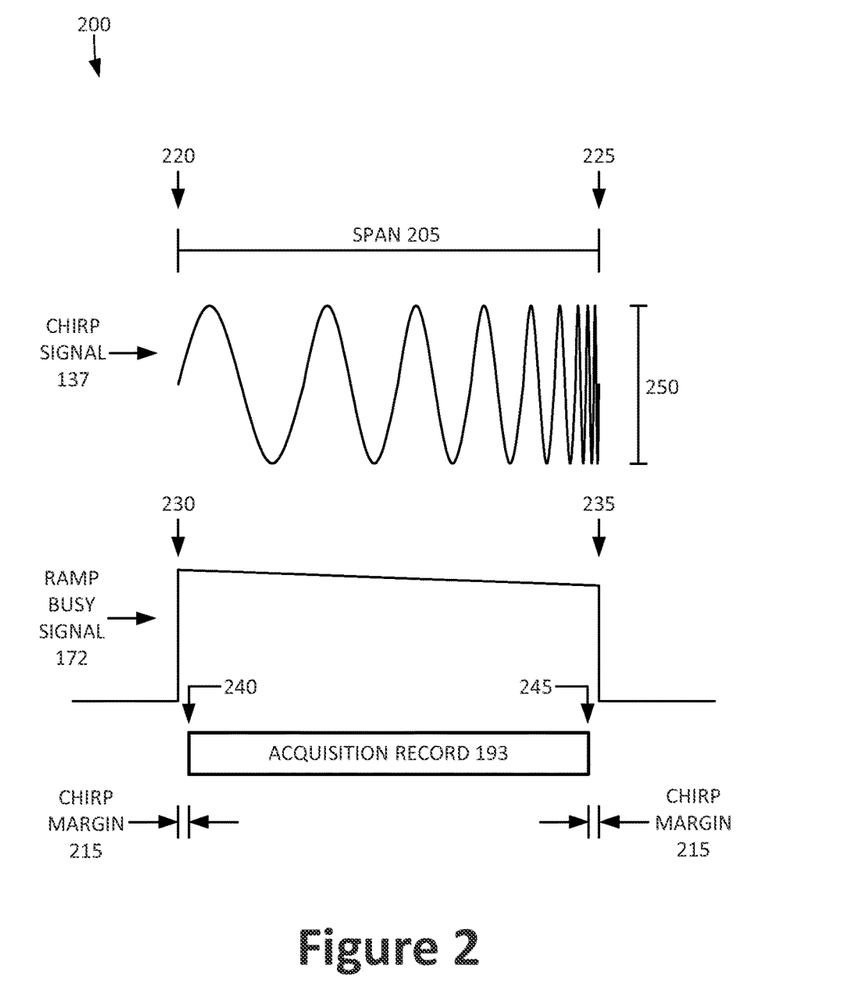
FIG. 2 is an example diagram of the relationship between a chirp signal, a ramp busy signal, an acquisition, and the like, in accordance with some embodiments of the present invention.

FIG. 2 is an example diagram of the relationship between a chirp signal 137, a ramp busy signal 172, an acquisition or acquisition record 193, and the like, in accordance with some embodiments of the present invention. As can be seen, the chirp signal 137 ranges over a selected span 205 from a user-configurable start frequency 220 to a user configurable stop frequency 225. The amplitude 250 of the chirp signal 137 is also user-configurable.

A length of the acquisition record 193 corresponds to the span 205 of the chirp signal 137 less a first chirp margin 215 at a beginning of the chirp signal 137 and less a second chirp margin 215 at the ending of the chirp signal 137. The first margin 215 is defined by a difference between a first edge 230 of the ramp busy signal 172 and the beginning 240 of the acquisition record 193. The second margin 215 is defined by a difference between a second edge 235 of the ramp busy signal 172 and the ending 245 of the acquisition record 193. The margins can be automatically determined. Alternatively, the margins can be manually selected.

The chirp signal 137 covers the span 205. It is preferable that the acquisition time duration, or in other words, the length of the acquisition record 193, be within the duration of the chirp signal 137. Otherwise, the acquisition record 193 would be incomplete if the length of the acquisition exceeded the chirp. It is beneficial to have the length of the chirp signal 137 cover and even slightly exceed the acquisition length. To optimize the dynamic range, it is desirable to have the acquisition record 193 use substantially the full chirp signal 137, with a relatively small amount of overlap or margin at the ends.

Figure 3:
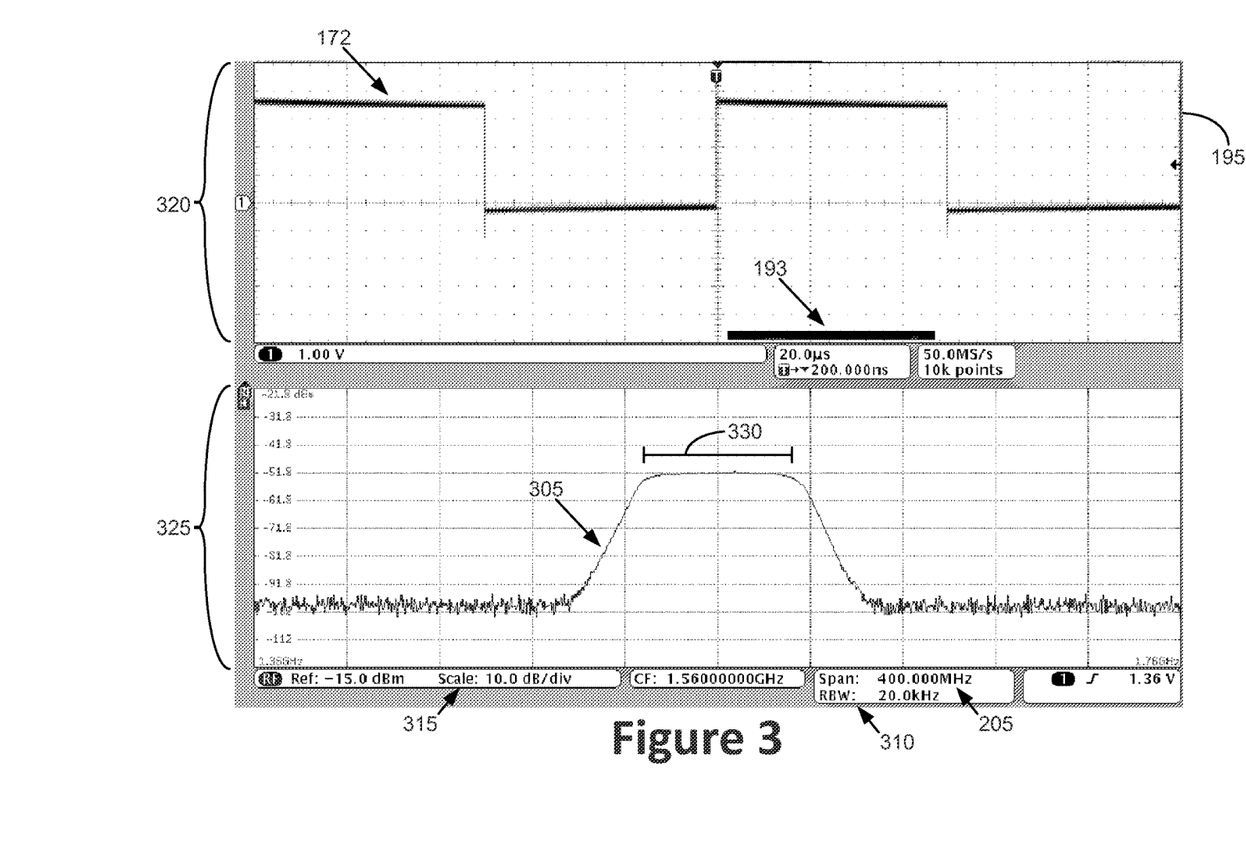
FIG. 3 is an example diagram of a display of the MDO in relation to FIGS. 1A and 1B, in accordance with some embodiments of the present invention.
Figure 4:
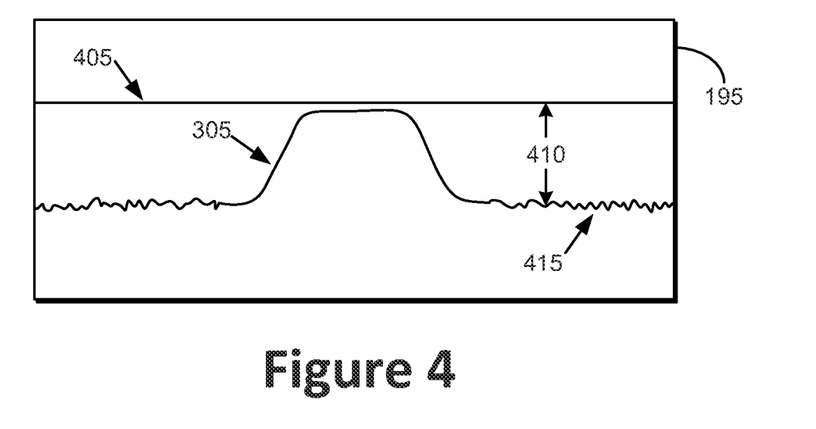
FIG. 4 is another example diagram of a display of the MDO in relation to FIGS. 1A and 1B, in accordance with some embodiments of the present invention.

FIG. 3 is an example diagram of a display 195 of the MDO in relation to FIGS. 1A and 1B, in accordance with some embodiments of the present invention. FIG. 4 is another example diagram of a display of the MDO in relation to FIGS. 1A and 1B, in accordance with some embodiments of the present invention. Reference is now made to FIGS. 3 and 4.

Window 320 of the display 195 shows an example of the ramp busy signal 172 and the position of the acquisition 193 relative to the ramp busy signal 172. The acquisition 193 can be manually positioned relative to the ramp busy signal 172. For example, the user can manually slide the acquisition 193 to a desired location within the ramp busy signal 172. Alternatively, the acquisition 193 can be automatically positioned relative to the ramp busy signal 172. It will be understood that the window 320 need not be present when the user desires to take measurements in accordance with the inventive concepts disclosed herein. For example, as shown in FIG. 4, there may be a single window showing the spectrum 305.

Window 325 shows a spectrum 305 of the return signal 142 after having been applied to a band pass filter 157 in an S21 type measurement. The band pass filter 157, for example, can be one of a plurality of components of the DUT 155. In this example, the span 205 is 400 MHz. The horizontal axis of the spectrum 305 represents frequency expressed in GHz and the vertical axis represents amplitude expressed in decibels. The scale 315 of the vertical axis in this example is set to 10 dB/div, but can be set to other suitable values. The resolution bandwidth (RBW) 310 in this example is set to 20 kHz.

If the chirp signal 137 is looped from the output port 135 (of FIGS. 1A and 1B) to the input port 140, then the return signal would appear as a substantially horizontal line 405 as shown in FIG. 4. This represents a substantially 100% transmission line, or in other words, the peak of the chirp signal across the predefined span. If instead the chirp signal 137 is transmitted to the DUT 155 (of FIGS. 1A and 1B), and the DUT 155 includes a band pass filter, then the return signal would appear as shown in window 325. In other words, the band pass filter passes part 330 of the line 405 and the rest is rejected by the filter. Put differently, when making an S21 type measurement of a DUT 105 having a band pass filter, loss is low in the pass band of the filter, and outside of the filter, the loss is increased.

The range of chirp frequencies depends on the width of the span 205. The wider the span 205, the less dynamic range there is. The dynamic range can be defined as the distance 410 between the reference line 405 and the noise floor 415. The noise floor 415 is determined at least in part by the RBW 310. The RBW 310 can be selected by the user to fit within the span 205 over which the user wants to make the measurement. There is a tradeoff between the amount of dynamic range and the span over which the user desires to make the measurement. The wider the span, the less dynamic range is available. Thus, the loss in dynamic range can be mitigated by controlling the width of the span. If a CW signal or tone is used in place of the chirp signal, then an improved dynamic range can be achieved because each individual frequency has associated therewith an individual acquisition. Although the CW signal approach improves the dynamic range, such approach is significantly slower than other methods described herein.

Figure 5:
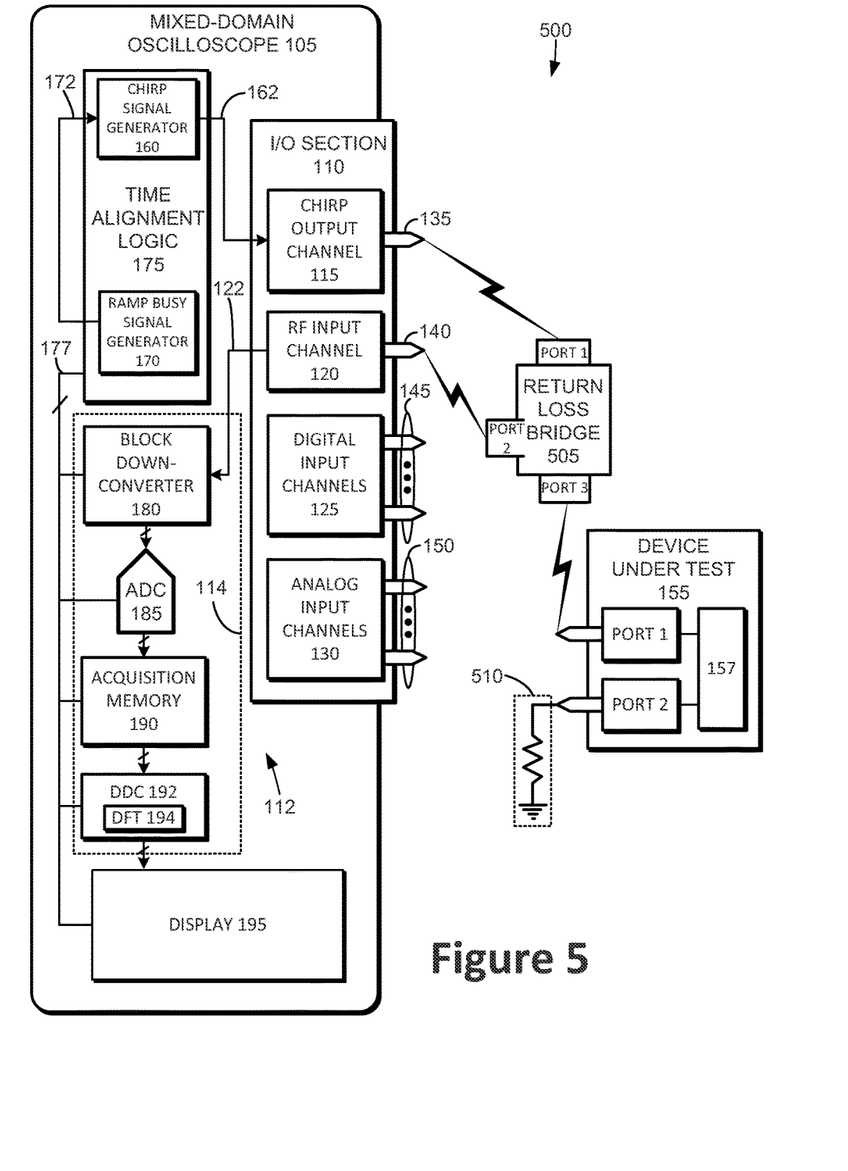
FIG. 5 is an example block diagram of another system including a return loss bridge, a detailed view of the MDO, and the device under test in accordance with some embodiments of the present invention.

FIG. 5 is an example block diagram of another system 500 including a return loss bridge 505, a detailed view of the MDO 105, and the DUT 155 in accordance with some embodiments of the present invention. The system 500 shown in FIG. 5 is particularly useful for making a single port scalar s parameter measurement, or in other words, an S11 (db) measurement.

The MDO 105 contains components that are similar to or the same as that described above with reference to FIGS. 1A and 1B, and therefore, a detailed description of such components is not repeated for the sake of brevity. Notably, the system 500 of FIG. 5 includes the return loss bridge 505. It will be understood that while the return loss bridge 505 is illustrated as an external return loss bridge, the return loss bridge 505 can alternatively be disposed internal to the MDO 105.

Generally, return loss bridges are passive devices and include three ports. The incident signal (e.g., the chirp signal) travels through one port until it hits the DUT, which is attached to another port of the return loss bridge. The reflected portion of the incident signal is detected by the RF input channel 120 of the MDO 105 via yet another port of the return loss bridge. It will be understood that other types of bridges may be used, such as a Wheatstone bridge (not shown), which measures a voltage across two terminals in the presence of signal reflection.

More specifically, the output channel 115 of the MDO 105 can be coupled to a first port (e.g., port 1) of the return loss bridge 505. The RF input channel 120 of the MDO 105 can be coupled to a second port (e.g., port 2) of the return loss bridge 505. The first port (e.g., port 1) of the DUT 155 can be coupled to a third port (e.g., port 3) of the return loss bridge 505. A second port (e.g., port 2) of the DUT 155 can be terminated, for example, using a 50 ohm terminator 510. In this configuration, the MDO 105 can make an S11 type measurement, which measures the reflection of a single port.

Figure 6:
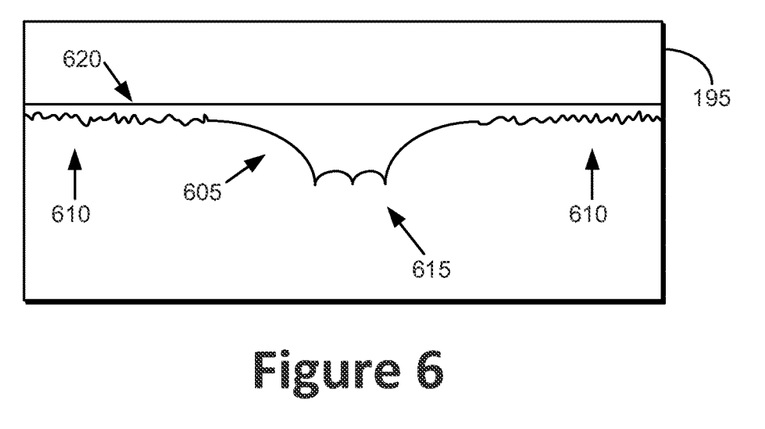
FIG. 6 is another example diagram of a display of the MDO in relation to FIG. 5, in accordance with some embodiments of the present invention.

FIG. 6 is another example diagram of a display 195 of the MDO 105 in relation to FIG. 5, in accordance with some embodiments of the present invention. Display 195 of FIG. 6 shows a spectrum 605 of the return signal 142 after having been applied to a band pass filter 157 in an S11 type measurement. When making an S11 type measurement of the DUT 155 having a band pass filter 157, the portions 610 of the spectrum 605 outside of the pass band of the incident signal is substantially entirely reflected back. Conversely, in the portion 615 of the spectrum 605 that is inside of the pass band, a lesser amount of the signal is reflected back. It will be understood that the DUT 155 can include components other than a pass band filter, and the resulting spectrums will depend on such components. A 100% reflection line 620 can be obtained by putting an open or short on a port (e.g., port 3) of the return loss bridge 505, i.e., the port of return loss bridge that is otherwise connected to the DUT 155. The 100% reflection line 620 can be calibrated prior to making the S11 (db) measurement, as further described below.

Figure 7:
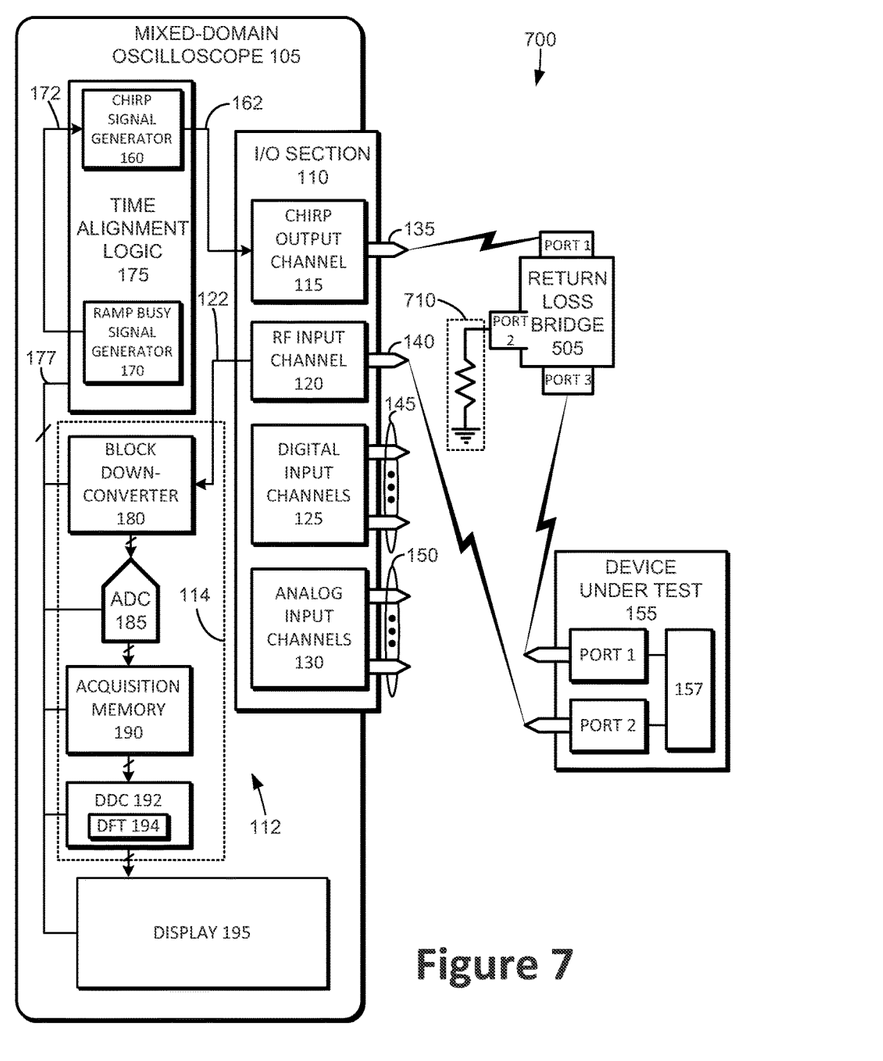
FIG. 7 is an example block diagram of still another system including a return loss bridge, a detailed view of the MDO, and the device under test in accordance with some embodiments of the present invention.

FIG. 7 is an example block diagram of still another system 700 including a return loss bridge 505, a detailed view of the MDO 105, and the DUT 155 in accordance with some embodiments of the present invention. The system 700 shown in FIG. 5 is an alternate configuration for making a 2 port scalar s parameter measurement, or in other words, an S21 (db) measurement.

The MDO 105 contains components that are similar to or the same as that described above with reference to FIGS. 1A and 1B, and therefore, a detailed description of such components is not repeated for the sake of brevity. Notably, the system 700 of FIG. 7 includes the return loss bridge 505. It will be understood that while the return loss bridge 505 is illustrated as an external return loss bridge, the return loss bridge 505 can alternatively be disposed internal to the MDO 105. Details of the return loss bridge 505 are not repeated for the sake of brevity.

The output channel 115 of the MDO 105 can be coupled to a first port (e.g., port 1) of the return loss bridge 505. A second port (e.g., port 2) of the return loss bridge 505 can be terminated, for example, using a 50 Ohm terminator 710. A third port (e.g., port 3) of the return loss bridge 505 can be coupled to a first port (e.g., port 1) of the DUT 155. The RF input channel 120 of the MDO 105 can be coupled to a second port (e.g., port 2) of the DUT 155. In this configuration, the MDO 105 can make an S21 type measurement of ports 1 and 2 of the DUT 155.

Figure 8:
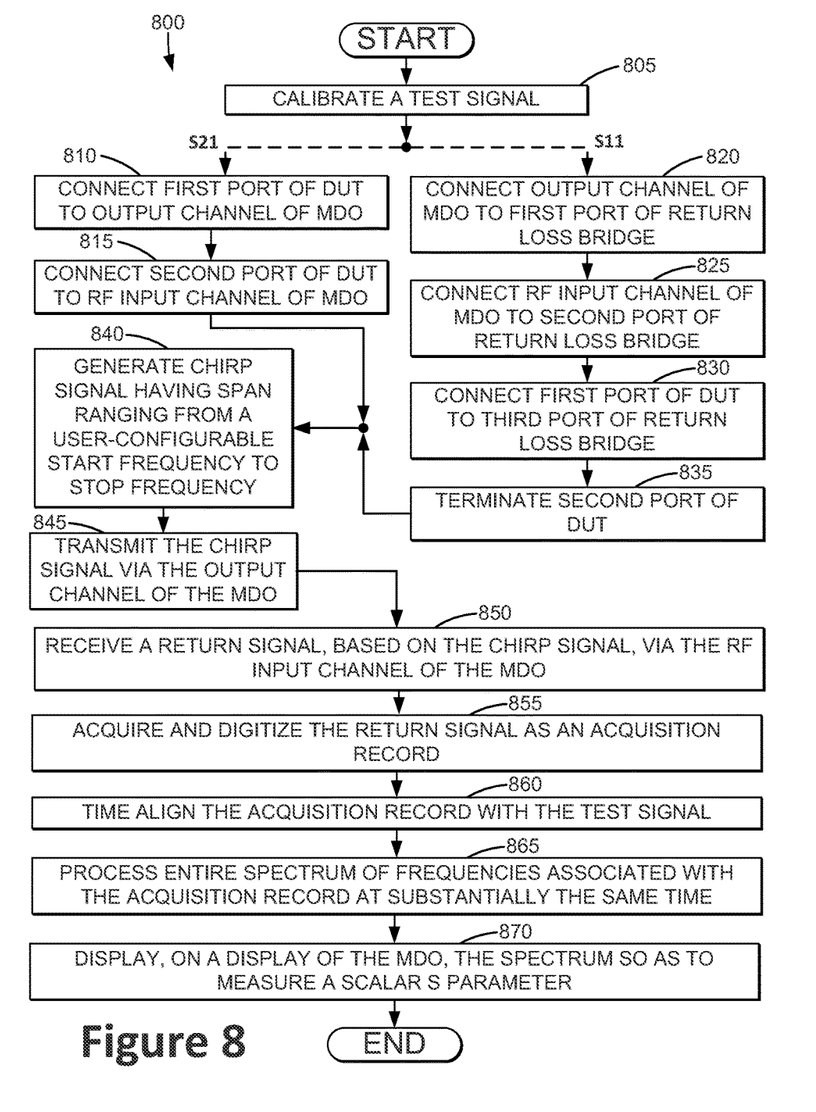
FIG. 8 is an example flow diagram illustrating a technique for measuring scalar s parameters on an MDO according to some embodiments of the present invention.

FIG. 8 is an example flow diagram 800 illustrating a technique for measuring a scalar s parameter on an MDO 105 according to some embodiments of the present invention. The technique begins at 805 where the test or chirp signal can be calibrated. For example, calibrating can include looping the chirp signal from the output channel 115 of the MDO 105 to the RF input channel 120 of the MDO 105. This results in the display of a horizontal reference line (e.g., 620 of FIG. 6) associated with the return signal. Any ripples or imperfections in the reference line 620 can be detected and calibrated out so that the reference line represents a 100% reflection reference line.

The flow proceeds along one of two branches, as indicated by branch S21 and branch S11. Branch S21 is followed when performing an S21 type measurement. Branch S11 is followed when performing an S11 type measurement.

Taking branch S21, a first port of the DUT is connected to an output channel of the MDO at 810. At 815, a second port of the DUT is connected to the RF input channel of the MDO.

Taking branch S11, an output channel of the MDO is connected to a first port of a return loss bridge at 820. At 825, the RF input channel of the MDO is connected to a second port of the return loss bridge. Along this path, the flow proceeds to 830, where a first port of the DUT is connected to a third port of the return loss bridge. At 835, a second port of the DUT is terminated.

Both of the branches S21 and S11 converge at 840, where a chirp signal having a span ranging from a user-configurable start frequency to a user-configurable stop frequency is generated. The flow then proceeds to 845, where the chirp signal is transmitted via the output channel of the MDO. The technique continues to 850, where a return signal is received via the RF input channel of the MDO. The return signal is based at least in part on the chirp signal, and represents the chirp signal after being passed through the DUT. At 855, the return signal is acquired and digitized as an acquisition record.

The acquisition record is time-aligned at 860 with the chirp or test signal. At 865, the entire spectrum of frequencies associated with the acquisition record is processed at substantially the same time, rather than on an individual frequency-then-acquisition basis. The entire spectrum is updated and displayed at 870 on the display of the MDO so as to easily and efficiently measure a scalar s parameter or other suitable test parameters.

It should be understood that the determinations in the flow diagram 800 need not occur in the specific order as described, but rather, these determinations can be made at different times. It will also be understood that the steps described in these techniques need not necessarily occur in the order as illustrated or described.

Embodiments of the inventive concepts disclosed herein provide for a "poor man's network analyzer" within an MDO, including an internally generated and transmitted chirp signal, a high speed acquisition, processing and display of the spectrum of the chirp signal in the frequency domain, and the flexibility and ease of use coincident with MDO functionality. Moreover, various types of measurements can be made such as an S21 type measurement, or when combined with a return loss bridge, an S11 type measurement or distance-to-fault type measurement.

Although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciated that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access. Embodiments of the inventive concept may include a non-transitory machine-readable medium comprising instructions executable by one or more processors, the instructions comprising instructions to perform the elements of the inventive concept as described herein.

Other similar or non-similar modifications can be made without deviating from the intended scope of the inventive concept. Accordingly, the inventive concept is not limited except as by the appended claims.

What is claimed is:

1. A method for measuring a scalar s parameter on a mixed-domain oscilloscope, the method comprising:
    generating, by a signal generator, a chirp signal having a span ranging from a user-configurable start frequency to a user configurable stop frequency, wherein the chirp signal is a linearly swept sine wave;
    transmitting, by an output channel, the chirp signal;
    receiving, by an input channel, a return signal that is based on the chirp signal;
    acquiring and digitizing the return signal as an acquisition record;
    time aligning the acquisition record with the chirp signal;
    processing a spectrum of frequencies associated with the acquisition record; and
    displaying, on a display of the mixed-domain oscilloscope, the spectrum so as to measure the scalar s parameter.

2. The method of claim 1, wherein the scalar s parameter is a S21 scalar s parameter, the method further comprising:
    connecting a first port of a device under test to the output channel of the mixed-domain oscilloscope;
    connecting a second port of the device under test to the input channel of the mixed-domain oscilloscope; and
    displaying, on the display of the mixed-domain oscilloscope, the spectrum so as to measure the S21 scalar s parameter.

3. The method of claim 1, wherein the scalar s parameter is a S11 scalar s parameter, the method further comprising:
    connecting the output channel of the mixed-domain oscilloscope to a first port of a return loss bridge;
    connecting the input channel of the mixed-domain oscilloscope to a second port of the return loss bridge;
    connecting a first port of a device under test to a third port of the return loss bridge;
    terminating a second port of the device under test; and
    displaying, on the display of the mixed-domain oscilloscope, the spectrum so as to measure the S11 scalar s parameter.

4. The method of claim 1, further comprising calibrating the chirp signal.

5. The method of claim 4, wherein calibrating the chirp signal further comprises:

looping the chirp signal from the output channel to the input channel;

displaying, on the display of the mixed-domain oscilloscope, a horizontal reference line associated with the return signal;

detecting ripples in the reference line;

calibrating out the ripples in the reference line.

6. The method of claim 1, further comprising:

selecting a resolution bandwidth to be within the span of the chirp signal.

7. One or more non-transitory computer-readable media having instructions stored thereon, which, when executed by one or more processors of a mixed-domain oscilloscope, cause the mixed domain oscilloscope to:

generate a chirp signal having a span ranging from a user-configurable start frequency to a user configurable stop frequency, wherein the chirp signal is a linearly swept sine wave;

output, via an output channel, the chirp signal to a device under test;

receive, via an input channel, a return signal that is based on the chirp signal;

acquire and digitize the return signal as an acquisition record;

time align the acquisition record with the chirp signal;

process a spectrum of frequencies associated with the acquisition record; and output for display the spectrum to enable measurement of a scalar s parameter.

8. The one or more non-transitory computer-readable media of claim 7, wherein the instructions further cause the mixed domain oscilloscope to:

loop the chirp signal from the output channel to the input channel;

output for display a horizontal reference line associated with the return signal;

detect ripples in the reference line;

calibrate out the ripples in the reference line.

9. The one or more non-transitory computer-readable media of claim 7, wherein the instructions further cause the mixed domain oscilloscope to: select a resolution bandwidth based on the span of the chirp signal.

* * * * *